United States Patent [19]

Chappell et al.

[11] Patent Number: 4,525,731

[45] Date of Patent: Jun. 25, 1985

[54] SEMICONDUCTOR CONVERSION OF OPTICAL-TO-ELECTRICAL ENERGY

[75] Inventors: Terry I. Chappell, Amawalk; Thomas N. Jackson, Ossining; Jerry M. Woodall, Bedford Hills, all of N.Y.

[73] Assignee: International Business Machines Corporation, Armonk, N.Y.

[21] Appl. No.: 454,784

[22] Filed: Dec. 30, 1982

[51] Int. Cl.³ .................... H01L 27/14; H01L 29/88; H01L 31/06

[52] U.S. Cl. ........................... 357/12; 357/4; 357/30; 357/58

[58] Field of Search ............. 357/30, 12, 4, 58

[56] References Cited

U.S. PATENT DOCUMENTS 4,127,862 11/1978 Ilegems et al. ............. 357/30
4,282,541 8/1981 Tsang .......................... 357/30

OTHER PUBLICATIONS

Electronics Letters, vol. 16, No. 22, 23rd Oct. 1980, pp. 836 & 837, "Planar-Doped Barriers in GaAs by Molecular Beam Epitaxy", by Malik et al.

International Electron Devices Meeting Technical Digest, Dec. 13-14-15, 1982, pp. 334-337, San Francisco, CA, "Superlattice, Graded Band Gap, Channeling and Staircase Avalanche Photodiodes Towards a Solid-State Photomultiplier" by Capasso et al.

Primary Examiner—William D. Larkins
Assistant Examiner—Eric Fallick
Attorney, Agent, or Firm—Alvin J. Riddles

[57] ABSTRACT

Optical-to-electrical conversion is accomplished using an undoped region bounded by a tunneling junction of the order of the mean free path of an electron. A number of regions are assembled in series with larger thickness away from the light incident surface. The thickness and doping of the regions for maximum effectiveness in monochromatic light are tailored to produce similar quantities of carriers from the light. A nine section GaAs structure with 50 Å $n^+$ and $p^+$ tunneling bounding regions has a 90% quantum efficiency and delivers a 5 volt output with a 0.35 picosecond transit time.

9 Claims, 3 Drawing Figures

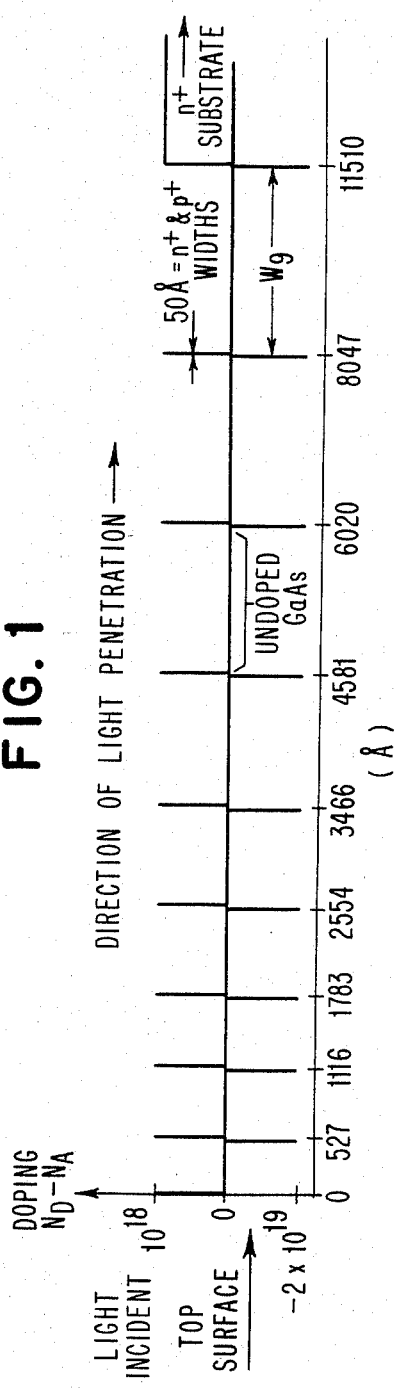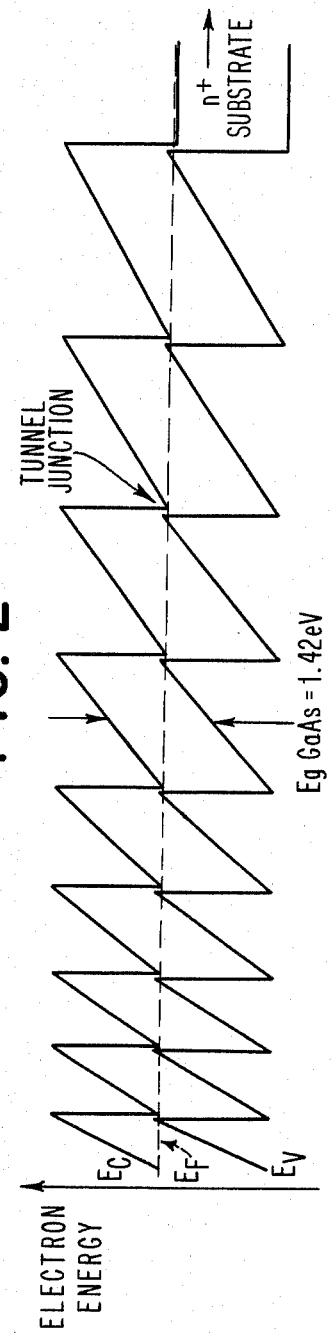

SEMICONDUCTOR CONVERSION OF OPTICAL-TO-ELECTRICAL ENERGY

DESCRIPTION

1. Technical Field

The technical field of the invention is that of the conversion of optical energy to electrical energy in a semiconductor device. Such devices operate on the principle that the light produces carriers in the semiconductor that in turn travel a distance within the device structure to a location where those carriers operate to deliver an output current. Light wavelengths penetrate the semiconductor to different depths and produce different quantities of carriers. The number of carriers produced and the distance they must travel are considerations in the design of the structure.

2. Background Art

As it became desirable to use more and more of the wavelength spectrum of light and to have the carriers travel shorter distances, several thin layers came to be used, each layer having properties compatible with a different wavelength so that more of the light could produce more carriers and a higher efficiency output is achieved.

A refinement of a multilayer structure for monochromatic light is the optical-to-electrical converter shown in U.S. Pat. No. 4,127,862 wherein doped layers of different thicknesses are joined with a low impedance contact, by using quantum mechanical tunneling junctions for the purpose of absorbing more of the monochromatic light and to produce a high voltage output. The device of U.S. Pat. No. 4,127,862, however, employs separate multiheterolayer photodiodes connected by separate tunneling junctions of the order of 1000 Angstroms in thickness, the resulting photocurrent occurs primarily by diffusion, and reports an output voltage of the order of 1.75 V using the semiconductor materials GaAs and AlGaAs.

BRIEF DESCRIPTION OF THE DRAWING

FIGS. 1, 2 and 3 are dimensionally correlated figures of the structure, the band energy diagram without illumination and the band energy diagram with illumination, respectively, of the invention using the material GaAs as an illustration.

DISCLOSURE OF THE INVENTION

Figure 3:
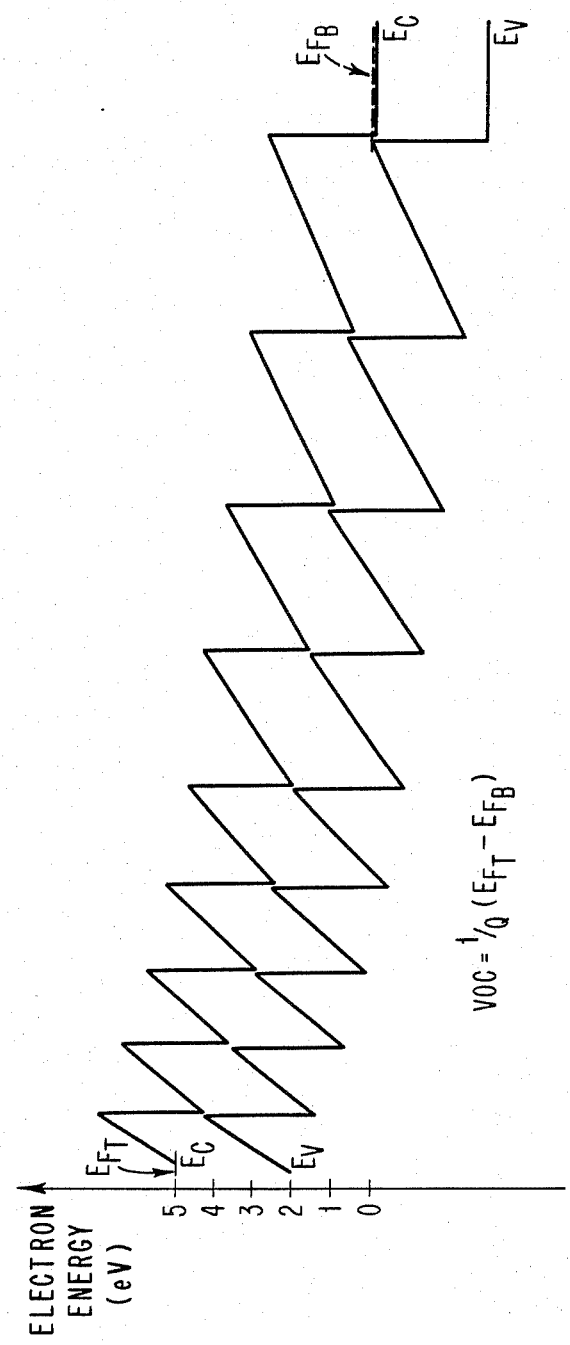

The invention involves a semiconductor, optical-to-electrical conversion principle, in which an absorbing element of an undoped region that is bounded by a thin tunneling junction elements together, act as a unit, to provide a high performance. In the structure of the invention the carriers are produced in an undoped region which provides a high field for carrier acceleration and relatively collision free movement over a significant portion of the undoped region and the undoped region is bounded by a thin, of the order of the mean free path of a carrier, quantum mechanical tunneling junction. The thickness of the undoped region is of the order of the ballistic transport thickness for a carrier in the material selected. The two criteria, the undoped absorbing region and the tunneling junction, operate to provide a condition where a carrier is moved primarily by drift rather than diffusion resulting in more carriers being effective, providing thereby increased efficiency, and, since the carriers can move more rapidly, faster turn-on and turn-off occurs in the $10^{-12}$ second range.

The undoped region should be sufficiently intrinsic that a high field is produced in the presence of light generated carriers. This is generally less than $10^{16}$ atoms per cc in most materials. The dimensions of the undoped region should be at least sufficient for substantial carrier generation but not exceeding the distance over which a substantial portion of the carriers would travel ballistically. This is of the range of about 500 to 3000 Å for most materials. The boundary p and n regions that form the tunneling p-n junctions should be of the order of the mean free path length of a carrier in the semiconductor being used from the undoped region through the heavily doped region. This is around 50 Å in most materials.

The invention is particularly useful with monochromatic light. In order to get the maximum from a single wavelength light impinging on an incident surface a plurality of undoped regions may be employed, each near ballistic transport thickness and becoming progressively thicker away from the surface and each joined to the adjacent one at the mean free path of a carrier thickness quantum mechanical tunneling junction with the total of all regions not exceeding the penetration depth of the light. The progressively thicker undoped regions are designed to have equal quantities of carriers in each region. The progressive thickness increase away from the surface is due to the exponential decay dependence of the absorption of light.

The principles of the invention are applicable to many semiconductor materials, including Si and GaAs, the ones receiving the most attention at this state of the art.

BEST MODE FOR CARRYING OUT THE INVENTION

In order to facilitate description, the principles of the invention will be set forth using as an example the material GaAs, although conversion of the parameters to values for other type semiconductor materials will be readily apparent to one skilled in the art.

Referring to FIG. 1, with the incident light entering at the location labelled top surface, each undoped region has an impurity concentration less than $10^{16}$ atoms per cc and the boundary p-n junctions of the progressive thickness regions are measured from the light incident surface. The regions vary from about 500 to 3500 Å. The boundary thickness of the p+ and n+ regions for the tunneling junctions is of the order of the mean free path of an electron which for GaAs is about 50 Å.

The substrate is provided with high n+ conductivity to facilitate external circuit connection. The second external circuit connection would be made to the light incident surface using the standard light receiving surface techniques of translucent electrodes or grids.

The energy band diagrams of the device without and with illumination are illustrated in FIGS. 2 and 3, respectively, wherein $E_C$, $E_F$ and $E_V$ are the conduction band energy level, the Fermi level and the valence band energy levels, respectively.

The thicknesses of the GaAs sections are designed so that the same number of hole electron pairs are produced in each of the sections when the device is illuminated by a monochromatic light source of a particular wavelength. The sections become wider away from the surface with the widest being labelled $W_9$. The total thickness and thus the number of sections is governed by the effective penetration depth of the light in the particular semiconductor material.

The design parameters of the structure are related as set forth in Equation 1.

$$e^{-\alpha(\lambda)\chi_n} - e^{-\alpha(\lambda)\chi_{n+1}} = C \qquad \text{(Eq. 1)}$$

where
- $\alpha(\lambda)$ is the absorption coefficient of the monochromatic light source,
- $\chi_n$ is the starting location of the $n^{th}$ layer,
- $\chi_{n+1}$ is the ending location of the $n^{th}$ layer,
- C is the fraction of light absorbed in each section, and
- $\chi_n - \chi_{n+1}$ is the width of the $n^{th}$ layer.

For the GaAs device with the specification set forth in FIG. 1, C will be equal to 0.1, $\alpha(\lambda)$ will be equal to $2 \times 10^4 \text{cm}^{-1}$, and the energy gap width is 1.42 eV.

Due to the thinness of the undoped GaAs sections and the presence of the n+ and p+ tunneling boundary regions, very high electric fields exist without the need for an external bias. This is illustrated referring to FIG. 2 by the large gradient in the energy bands as they traverse these regions. Electric fields of 40,000 V/cm or more may exist in all of the individual sections resulting in very rapid carrier transport. The high fields, however, do not produce intervalley carrier transitions because the undoped regions, being in the ballistic transport thickness dimension range, are too thin. Thus, the structure will accommodate carrier velocities much greater than the saturation drift velocity associated with non-ballistic carriers which dominate transport in thicker layer devices.

In the illustration of FIG. 1, the photovoltages of all of the sections will provide a quantum efficiency of 90% and will add together to give an output of the order of 5 volts which is directly compatible with most semiconductor circuitry.

Referring to FIG. 3, the effect of the added voltages is seen where the open circuit voltage is as expressed in Equation 2.

$$V_{oc} = 1/Q \ (E_{FT} - E_{FB}) \qquad \text{(Eq. 2)}$$

where
- $E_{FT}$ is the Fermi level at the illuminated surface,
- $E_{FB}$ is the Fermi level below the illuminated surface, and
- Q is the electron charge.

The transient response of the device of this invention is limited by the transit time of the photogenerated carriers in the widest section, $W_9$. This is because the photocurrent is collected simultaneously by all of the sections with the widest section $W_9$ being the slowest. For the device of FIG. 1, the transit time is as expressed in Equation 3.

$$t_r = \frac{W_9}{v_{trans}} = \frac{3463 \times 10^{-8} \text{ cm}}{10^8 \text{cm/sec}} = 0.35 \text{ picoseconds} \qquad \text{Eq. 3}$$

where
- $W_9$ is the width of the widest of the 9 regions, and
- $v_{trans}$ is the average velocity that the slowest carrier can assume if it traverses the $W_9$ width region ballistically.

In comparison, consider that the limiting transient response of a conventional GaAs single junction photodiode with the same quantum efficiency of 90% would be $1.15 \times 10^{-4}/10^7 = 11.5$ ps since not only is the width of the widest and only section increased to $1.15 \times 10^{-4}$ cm but also $v_{trans}$ is limited to $10^7$ cm/sec for non-ballistic carriers. Thus, the 0.35 picosecond transit time of the structure of FIG. 1 of the invention is essentially a thirty-fold improvement in transit time. The response time of a device would also include the time required for ballistic carriers to thermalize to the bond edge.

The structure of the invention may be compared with the prior art U.S. Pat. No. 4,127,862 in that in the structure of 4,127,862 separate photodiodes are joined by tunneling junctions which since they are independent do not have to be narrow. In contrast, applicants merge these elements into a simpler and much higher performing structure by providing thin planar p and n regions that serve as tunneling boundaries to an undoped region and the two together both collect carriers and act as a tunnel diode.

The structure of the invention may be even further compared with the strucrure of U.S. Pat. No. 4,127,862 in which the tunneling boundary regions are 1000 Å or more in thickness and the photoactive regions are uniformly doped. This results in a slower transient response in at least two ways. First, the substantial thickness of the doped regions result in diffusion rather than drift dominating the collection time of the photogenerated carriers. Second, the relatively large thickness of the first current collection region of 6000 Å in the example structure results in a second current collection region which must be larger, and hence substantially slower. The example structure of U.S. Pat. No. 4,127,862 is carried to two layers which requires 81,000 Å of layered structure whereas the GaAs example, 9 layer structure of FIG. 1 requires only 11,510 Å.

From this comparison, it may be seen that the principles of this invention can produce very narrow current collection regions which in turn operate in the ballistic mode or carrier transport with transient responses in the subpicosecond range.

Structures employing the principles of the invention are directly compatible with semiconductor circuitry and are useful for the direct rectification and mixing of electromagnetic radiation at light wavelengths.

Most conventional photodetectors when used with pulse responsive circuits require the use of a preamplifier, means for level restoration and pulse shaping circuitry. It will be further apparent from the principles of this invention that direct interfacing with pulse responsive circuitry is readily accommodated. Where fiber optic pulsed communication systems are involved, this capability reduces the complexity of a fiber optical communication system, lowering the cost and improving the reliability. Further, where the fiber optic system communicates with a semiconductor chip, less devices occupying less chip area are involved.

The structure of FIG. 1 may be fabricated by the technique well known in the art of molecular beam epitaxy wherein through the use of a molecular beam both the material of the crystal and the resultant dopant are provided together in an epitaxial layer with each layer and each boundary being precisely grown from the substrate.

One of the advantages of molecular beam epitaxy is the rapidity with which transitions can be made from one type material to another while retaining crystalline periodicity. With this technique, the desired 50 Å n+ and p+ tunneling junction boundaries are readily achieved. A technique of achieving such transitions is known in the art as planar doping. The details of the planar doping technique is described in Electronics Letters October 1980, Vol. 16, No. 22, page 836.

It is preferred for safety reasons that the p+ GaAs regions in the device be realized using Mg doping rather than Be doping as is used in most prior art devices. The Be is poisonous and requires great care. Efficient doping with Mg is achieved using a special volatile oxide suppression technique as described in copending IBM patent application, Ser. No. 311,091 filed Oct. 13, 1981.

What has been described is a principle of light-to-electrical conversion wherein an undoped layer of ballistic transport thickness is bounded by a tunneling barrier of the order of the mean free path of an electron in thickness. Several progressively thicker layers each tailored for the generation of roughly equivalent carriers are provided in a high output voltage, rapid response structure. Since both the tunneling boundary regions and the undoped carrier generation regions are so thin, the carriers are moved by drift rather than diffusion as the transport mechanism which permits the device to be faster with higher output voltages. The structure can be tailored to be directly compatible with different types of circuitry.

Having thus described our invention, what we claim as new and desire to secure by Letters Patent is:

1. In a semiconductor optical-to-electrical energy converter of the type having a plurality of serially connected semiconductor regions joined by quantum mechanical tunneling junctions, the improvement comprising each region being undoped and having a thickness dimension of the order of ballistic transport and each tunneling junction being of the order of the mean free path of a carrier in the semiconductor material of said tunneling junctions.

2. The converter of claim 1 wherein said semiconductor is GaAs.

3. The converter of claim 2 wherein said undoped regions are in the range of from 100 to 3500 Å and said tunneling junctions are of the order of 50 Å.

4. A semiconductor optical-to-electrical energy converter comprising in combination in a monocrystalline semiconductor body having a surface for receiving an incident light.
   a plurality of serially connected light absorbing regions each region being undoped and each region having a progressively larger thickness dimension increasing with distance from said surface for receiving an incident light, said dimension not exceeding ballistic transport distance, and
   each light absorbing region being bounded by a quantum mechanical tunneling p-n junction having a thickness of the order of the mean free path of an electron.

5. The converter of claim 4 wherein said regions are of GaAs.

6. A semiconductor optical-to-electrical energy converter comprising a light absorbing undoped region bounded by a quantum mechanical tunneling p-n junction of the order of the mean free path of a carrier in the region of said p-n junction.

7. The optical-to-electrical converter of claim 6 wherein said undoped region has a thickness dimension of the order of the ballistic transport distance of a carrier in said undoped region.

8. The energy converter of claim 7 wherein a plurality of said light absorbing regions are serially positioned with respect to a light incident surface, each region having a progressively larger thickness dimension of said undoped region with distance from said light incident surface.

9. The energy converter of claim 8 wherein the material of said semiconductor is GaAs.

* * * * *